United States Patent [19]

Wheatley, Jr.

[11] 4,035,827
[45] July 12, 1977

[54] THERMALLY BALLASTED SEMICONDUCTOR DEVICE

[75] Inventor: Carl Franklin Wheatley, Jr., Somerset, N.J.

[73] Assignee: RCA Corporation, New York, N.Y.

[21] Appl. No.: 681,484

[22] Filed: Apr. 29, 1976

[51] Int. Cl.² ............................ H01L 27/10
[52] U.S. Cl. .................. 357/45; 357/46; 357/51
[58] Field of Search ............ 354/40, 45, 46, 51, 354/28, 36, 20; 307/297, 303, 310, 254, 318

[56] References Cited

U.S. PATENT DOCUMENTS

| 3,440,715 | 4/1969 | Seng | 357/46 |
| 3,461,357 | 8/1969 | Mutter et al. | 357/51 |
| 3,510,735 | 5/1970 | Patter | 357/51 |
| 3,544,860 | 12/1970 | Lichowsky | 307/303 |
| 3,694,705 | 9/1972 | Wenzig | 357/20 |

OTHER PUBLICATIONS

H. Wolf, *Semiconductors*, Wiley-Interscience,© 1971, pp. 310–312.

Primary Examiner—Michael J. Lynch
Assistant Examiner—James W. Davie
Attorney, Agent, or Firm—H. Christoffersen; R. P. Williams; R. A. Hays

[57] ABSTRACT

A semiconductor device comprising a plurality of cells is disclosed. Each cell contains at least one bi-polar transistor and a diode serially connected to the base of the transistor therein. Each cell is connected in parallel relation with each other cell. The diode in each cell is located in close proximity to the transistor therein so that the thermal gradient therebetween is small.

6 Claims, 3 Drawing Figures

THERMALLY BALLASTED SEMICONDUCTOR DEVICE

The present invention relates to semiconductor devices in general and, in particular, relates to those devices which are thermally ballasted.

Semiconductor devices, particulary those designed to handle relatively large amounts of power, are often comprised of a plurality of cells which are connected in parallel relation with each other. In a power transistor for example, each cell contains at least one transistor therein. Such a device is usually limited in its power handling capability by its thermal characteristics. That is, a semiconductor device which handles a relatively large amount of power also generates a considerable amount of internal heat. This internal heat must be either dissipated or distributed to prevent instability within the device. If the heat is not properly dissipated or distributed individual cells can be damaged or destroyed, thereby preventing the useful operation of the overall device.

Inefficient thermal dissipation within a device exists for a number of reasons. For example, crystal imperfections within the semiconductor material or a point of poor contact to a heat sinking mechanism are generally sources of inefficient thermal dissipation.

It is desireable, therefore, in such a device, to provide means for preventing thermal damage to, or destruction of, any individual cell, thereby maintaining the thermal stability of the device.

Figure 1:
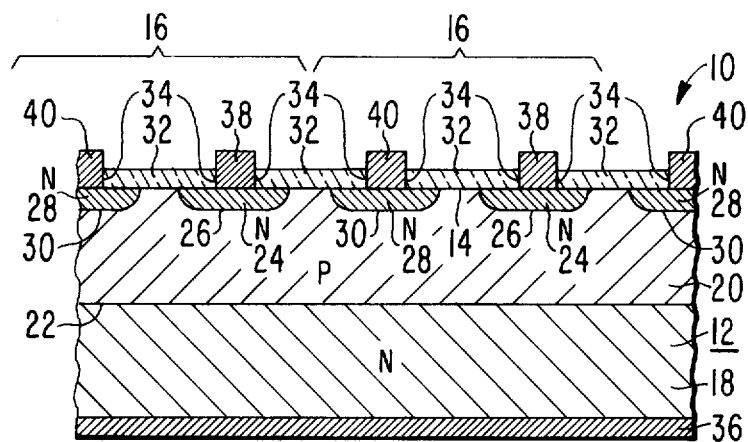
FIG. 1 is a partial cross-sectional view of one embodiment of the present device, not drawn to scale.
Figure 3:
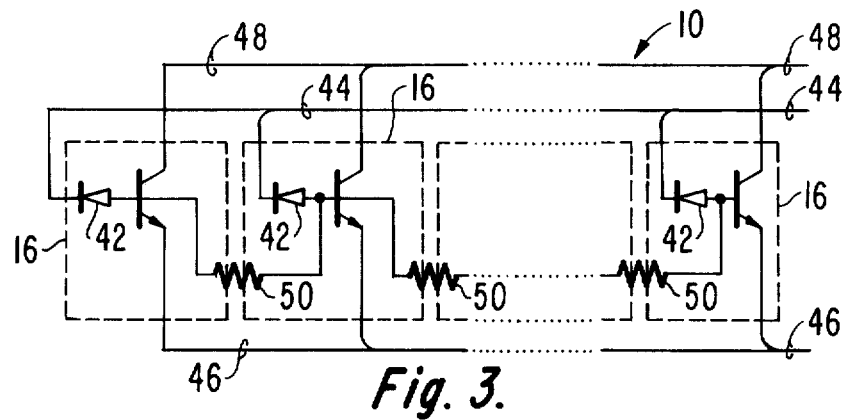
FIG. 3 is a schematic representation of the present device.

One embodiment of the present device, indicated generally at 10 in FIGS. 1 and 3 of the drawings, comprises a body 12 of semiconductor material initially having a one type conductivity, for example N type, having a surface 14 and containing therein a plurality of cells 16. Each cell 16 contains means which act as at least one bipolar transistor. In this embodiment the transistors of the device 10 have a common collector region 18 having the one type conductivity, and a common base region 20 having a second type conductivity, P type in this example, forming a first PN junction 22 with the common collector region 18 at the interface therewith. Each transistor has associated therewith an emitter region 24 having the one type conductivity. The plurality of emitter regions 24 of the device 10 form a plurality of second PN junctions 26 with the common base region 20.

A common diode region 28 having the one type conductivity is disposed in the common base region 20 and forms a third PN junction 30 at the interface therewith. The common diode region 28 is spaced apart from each of the plurality of emitter regions 24. As shown in FIG. 1 the diode region 28, for reasons explained below, may have a conductivity profile and depth which is substantially the same as that of the emitter regions 24. The diode region 28 can also be fabricated as a plurality of separate regions.

The second and third PN junctions, 26 and 30 respectively, terminate at the surface 14. For conventional reasons a layer 32 of passivating material, for example, silicon dioxide, having openings 34, overlies the surface 14.

A collector electrode 36 of conductive material, for example nickel-lead, electrically contacts the common collector region 18. Emitter electrodes 38 of conductive material electrically contact each of the emitter regions 24 through some of the openings 34 of the layer 32. A diode electrode 40 of conductive material electrically contacts the common diode region 28 or each of a plurality of diode regions in the alternative embodiment not shown through the remainder of the openings 34 of the layer 32.

The common diode region 28 is, in this embodiment, continuous and common to each transistor. That is, a separate diode region 28 for each transistor is not necessary so long as the base region 20 associated with each transistor is effectively current fed through the diode region 28. For example, each transistor has a base region 20 associated therewith through which a base current, $I_b$, flows during the operation of the transistor. In the present device, this base current, to reach the active transistor, must flow through the diode region 28 and across the third PN junction 30. Hence, each transistor's base region 20 is current fed through a diode 42, as shown schematically in FIG. 3.

The present device 10 is schematically represented in FIG. 3. Therein, a plurality of cells 16 are shown connected in an electrically parallel relationship. The interconnection lines, or feeds, 44, 46 and 48, associated with the diodes 42, the emitter regions 24 and the collector regions 18 are schematic representations of, for example, surface metallizations on the device 10; that is, as in conventional devices, the various regions of the cells 16 may be interconnected by surface metallization patterns on the body 12. The cathode of the diodes 42 schematically represent the portion of the common diode region 28 associated with each transistor. Each diode 42 is shown serially connected between the feed 44 and the portion of the common base region 20 associated with each transistor. Resistors 50 are schematically shown connected between the portion of the base region 20 which is most active in any transistor and the portion of the base region 20 which is most active in an adjacent transistor. The resistors 50 represent the inherent resistance of the material of the common base region 20 separating each transistor and is considered a parasitic, rather than an active, region between each cell 16. That is, while this resistance sustains some current between adjacent transistors it is not deemed to be an active region of the transistor.

Figure 2:
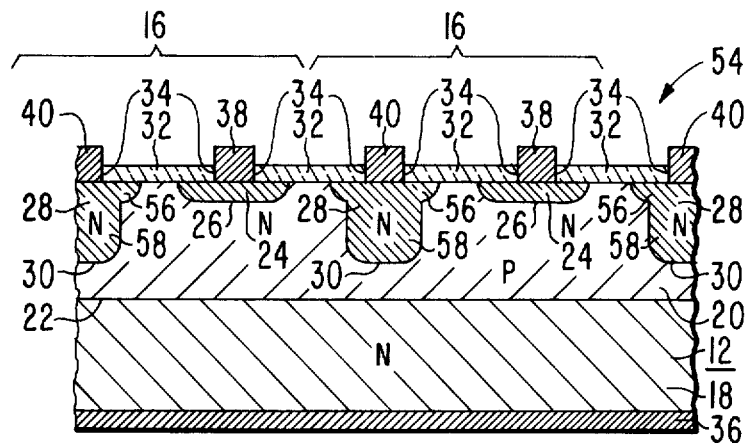
FIG. 2 is a partial cross-sectional view of another embodiment of the present device, not drawn to scale.

It is desirable to minimize the current flowing between adjacent transistors to prevent one transistor from drawing a large share of the total base current to the detriment of the adjacent transistors. To accomplish a more balanced distribution of base current it is preferable that the resistances of the resistors 50 be comparatively large. Another embodiment of the present device, shown in FIG. 2 and indicated generally at 54 therein, is designed to provide such a comparatively large resistance. For clarity, all features of the second embodiment device 54 which correspond with features of the one embodiment device 10 are indicated by the same numerals used in FIG. 1. As shown in FIG. 2, the diode region 28 extends further into the common base region 20 than the emitter regions 24. The diode region 28 has, in this embodiment, an upper portion 56 and a lower portion 58. The diode region 58, by this configuration, provides means which defines a comparatively higher valued pinch resistor between adjacent cells than exists in the device 10. The pinch resistor effect is well known in the semiconductor art and is generally characterized by the reduction of the cross-sectional area of a current path in a region of semiconductor material by forming a section of opposite type material therein. By reducing the cross-sectional area of the current path the effective resistance thereof is increased.

The pinch resistor effect can be implemented in the device 54 by employing two N type diffusions to form the diode region 28. The preferred procedure is to initially form the comparatively deeper, narrower portion 58 of the diode region 28 using a mask which generally aligns that portion substantially central to the desired resulting diode region 28. After the comparatively deeper, pinch resistor portion 58 is formed, the comparatively shallower, wider, diode portion 56 is formed, preferably simultaneously with the formation of the emitter regions 24. Preferably the deeper portion 58 and the comparatively shallower, wider portion 56 are aligned so that the upper portion 56 substantially completely overlaps the lower portion 58. This procedure allows the desired depths of the pinch resistor portion 58 to be formed while maintaining an accurate separation between the emitter regions 24 and the diode region 28. Accurate separation provides a substantially constant physical and thermal proximity between the transistor and diode of each cell 16. Alternatively the upper diode portion 56 and the deeper narrower pinch resistor portion 58 could be completely formed initially and then the emitter region 24 formed thereafter. This alternative has the drawback in that since the alignment of two masks determines the separation between the emitter regions 24 and the diode region 28 the accuracy of the spacing therebetween is comparatively reduced. The depth to which the lower portion 58 is driven is not critical. As long as some of the common base region 20 separates the common collector region 28 and the diode region 28, the operation of the diodes 42, to be discussed below, remains effective. Yet another embodiment, not shown in the drawings, which would effectively isolate the cells, has a plurality of spced apart base regions provided in a body of semiconductor material. Each base region would then contain an emitter region and a diode region.

The diodes 42 are operated in a reverse biased avalanche mode to provide current paths from the base feed 44 to the base region 20 associated with each transistor. As such, each diode 42 has a comparatively non-negative; i.e., either zero or positive, voltage temperature coefficient with respect to the voltage temperature coefficient of the second PN junctions 26, i.e., the base-emitter PN junctions 26, which are oridnarily operated in the forward conduction mode. This characteristic is assured if the emitter regions 24 and the shallower diode portion 56 are formed simultaneously.

The diodes 42 preferably have a positive voltage temperatue coefficient of about +0.08% of the operating avalanche voltage per degree Centigrade. The base-emitter PN junctions 26 typically have a negative-temperature coefficient of about −2.0 millivolts per degree Centrigrade. As used herein, a positive voltage temperature coefficient is a measure of the increased voltage applied across a diode, for example, necessary to maintain a given current therethrough when the temperature of the diode is increased a given amount. That is, the resistance to current flow through the diode has increased. Similarly, a negative voltage temperature coefficient is a measure of the decreased voltage applied across a diode, for example, necessary to maintain a given current therethrough when the temperature of the diode is increased a given amount. Under increased thermal stress the reverse bias breakdown voltage of the diode 42 increases. That is, comparatively more voltage is required to operate the diode in an avalanche mode at comparatively higher temperatures than at comparatively lower temperatures. It is pertinent to this invention therefore that the diodes 42 operate in the reverse biased avalanche breakdown mode.

The operation of the present devices 10 and 54 is as follows. The device 10 is fed from a constant current source, not shown, which provides a preselected current, $I_b$, to each cell 16. The emitter regions 24 and the common collector region 18 are also at preselected voltage potentials. If, for any reason, one of the transistors overheats, the base-emitter PN junction ordinarly draws more current, thereby requiring the base region 20 to deliver more current to the corresponding emitter region 24. However, due to the close proximity of the diode 42 to the transistor, the reverse biased avalanche breakdown voltage of the diode 42 has increased, due to its increased temperature, and the transistor receives a reduced base current. That is, the diode 42, characterized by the third PN junction 30 provides a means which is responsive to temperature increases of the base region 20 and which increases the resistance between the diode electrode 40 and the base region 20. That is, because the reverse biased avalanche breakdown voltage of the diode 42 has increased the resistance to current flow therethrough has also increased. The overheated transistor receives reduced base current and is thereby for all intents and purposes biased at lesser power dissipation relative to the adjacent cells, resulting in a desired thermally degenerative device 10.

A transistor which is turned down, remains thermally stressed; however, it does not substantially affect the operation of the overall device 10 or 54. The portion of the base current, $I_b$, which no longer flows in the turned down transistor is substantially equal divided among each of the other transistors because of the parallel relation thereof. It follows therefrom that the base-emitter PN junction of all other transistors in the device 10 or 54 has a relatively small increased current flowing therethrough. The impact of a single turned down transistor upon the other transistors in a device 10 or 54 decreases as the total number of transistors therein increases because the current from the turned down transistor is correspondingly smaller. Furthermore, since the temperature of a particular region of a device 10 or 54 is determined, at least partially, by the amount of current flowing in that region, the temperature distribution is altered by the redistribution of the current. It can be seen, therefore, that if a heat sinking void or a localized crystal imperfection causes a transistor to overheat, only that transistor is turned down rather than being damaged or destroyed. Thus the adjacent transistors have only a relatively small increase in operating current and are not damaged or destroyed. This is in direct opposition to presently fabricated thermally regenerative power transistors wherein an overheated cell, caused by a solder void, for example, increases its operating current and thereby reducing the current and power dissipation of the adjacent cells. Advantageously, in the present invention, similar to the current redistribution, the excess heat is redistributed among all of the other transistors in the device 10 or 54 and, therefore, the effect upon each is minimized.

The primary discussion to this point has been concerned with the turning down of a thermally stressed transistor within a device such as the device 10 or 54 and, therefore, the effect upon each is minimized.

The primary discussion to this point has been concerned with the turning down of a thermally stressed transistor within a device such as the device 10 or the device 54 and the redistribution of the excess current created thereby among the remaining transistors therein. As discussed above, one method of accomplishing this is to form a diode 42 in series with the base region 20 which has a voltage temperature coefficient which is non-negative with respect to the absolute value of the voltage temperature coefficient of the base-emitter PN junction 24. The diode 42 can be formed, using methods known in the art, for example, by varying the impurity concentration of the diode region 28, so that the comparative voltage temperature coefficient between the diode 42 and the base-emitter PN junction is effectively zero. However, if a device, were comprised of just a single cell such as that described in U.S. Pat. No. 3,111,590 issued to Noyce, and that cell 16 were thermally stressed, the device, in that application, could fall. Hence the present invention is generally not applicable, as such, to single transistor cells.

As mentioned above, it is peferred that the diodes 42 be positioned in close proximity to the base region 20 associated with the transistors. This is desirable since if there is a heat sinking void or crystal imperfection which causes a transistor's base region to become thermally stressed the diode 42 is substantially simultaneously similarly stressed. Hence, because of the small thermal gradient between the diode 42 and the transistor's base region, due to their close physical proximity, the transistor can be turned down prior to the device 10 or 54 being damaged or destroyed.

What is claimed is:

1. A semiconductor device comprising:
    a body of semiconductor material containing a plurality of cells, each said cell containing a transistor having associated therewith an emitter region having a one type conductivity, a base region of a second conductivity, a base-emitter PN junction having a voltage temperature coefficient associated therewith therebetween, and a collector region of said one type conductivity, said collector region being spaced apart from said emitter region by said base region, said emitter and collector regions of each said cell being connected in parallel relation with said emitter and collector regions of each other said cell; and
    means, integrally within each of said cells, responsive to temperature increases of said base region for increasing the resistance between an electrode means and said base region, said electrode means electrically contacting said responsive means, each said responsive means being a diode having a positive voltage temperature coefficient with respect to the absolute value of said voltage temperature coefficient of said base-emitter PNjunction.

2. A semiconductor device as claimed in claim 1 wherein:
    said transistors have a common collector region; and
    said transistors have a common base region.

3. A semiconductor device as claimed in claim 2 wherein:
    the diodes comprise a common diode region having said one type conductivity disposed in said common base region and spaced apart from said common collector region and said emitter regions thereby.

4. A semiconductor device as claimed in claim 3 wherin:
    said common diode region has a comparatively deeper narrower portion and a comparatively shallower, wider portion.

5. A semiconductor device as claimed in claim 3 wherein:
    said common diode region is in thermal proximity with each of said transistor.

6. A semiconductor device as claimed in claim 1 further comprising:
    means defining a pinch resistor between adjacent cells, said means being a deeper portion of each said diode, said deeper portion extending comparatively further into each said cell than each said diode.

* * * * *